US012721101B2

(12) United States Patent
Sunohara et al.

(10) Patent No.: US 12,721,101 B2
(45) Date of Patent: Aug. 25, 2026

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Masahiro Sunohara, Nagano (JP); Tatsuya Nakamura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 163 days.

(21) Appl. No.: 18/768,536

(22) Filed: Jul. 10, 2024

(65) Prior Publication Data

US 2025/0022738 A1 Jan. 16, 2025

(30) Foreign Application Priority Data

Jul. 12, 2023 (JP) ................................ 2023-114304

(51) Int. Cl.
*H10P 72/72* (2026.01)
*H01J 37/32* (2006.01)

(52) U.S. Cl.
CPC ........ *H10P 72/72* (2026.01); *H01J 37/32724* (2013.01); *H01J 2237/334* (2013.01)

(58) Field of Classification Search
CPC .......... H01J 37/32724; H01J 2237/334; H10P 72/0402; H10P 72/72; H10P 72/722; H10P 72/7616; H10P 72/7624
USPC .......................................................... 361/234
See application file for complete search history.

(56) References Cited

U.S. PATENT DOCUMENTS

2009/0243236 A1* 10/2009 Hida ...................... H10P 72/72 279/128
2016/0276196 A1* 9/2016 Parkhe .................... H10P 72/72
2022/0208593 A1* 6/2022 Muramatsu ......... H10P 72/0432
2022/0270906 A1* 8/2022 Parkhe .................. H10P 72/722

FOREIGN PATENT DOCUMENTS

JP H10-107133 A 4/1998

* cited by examiner

*Primary Examiner* — Kevin J Comber
(74) *Attorney, Agent, or Firm* — Rankin, Hill & Clark LLP

(57) ABSTRACT

An electrostatic chuck includes a first base body, a first adhesive layer, a second base body stacked on the first base body with the first adhesive layer interposed therebetween, and an electrostatic electrode embedded in the second base body. The first base body is made of aluminum oxide ceramics. The second base body is made of aluminum oxide ceramics with a higher purity of aluminum oxide than that of the first base body.

9 Claims, 6 Drawing Sheets

ELECTROSTATIC CHUCK AND SUBSTRATE FIXING DEVICE

CROSS-REFERENCE TO RELATED APPLICATIONS

This application claims priority from Japanese Patent Application No. 2023-114304 filed on Jul. 12, 2023, the contents of which are incorporated herein by reference.

TECHNICAL FIELD

The present disclosure relates to an electrostatic chuck and a substrate fixing device.

BACKGROUND ART

In the related art, a film formation apparatus (for example, a CVD apparatus, a PVD apparatus, and the like) and a plasma etching apparatus that are used when manufacturing a semiconductor device such as an IC and an LSI have a stage for accurately holding a wafer in a vacuum treatment chamber.

As such a stage, for example, suggested is a substrate fixing device that adsorbs and holds a wafer, which is a target object to be adsorbed, by an electrostatic chuck mounted on a base plate.

As an example of the electrostatic chuck mounted on the substrate fixing device, there is one in which two types of base bodies made of ceramics are stacked. The two types of base bodies are formed integrally by, for example, high-temperature fusion.

CITATION LIST

Patent Literature

Patent Literature 1: JPH10-107133A

SUMMARY OF INVENTION

However, the high-temperature fusion is not a simple stacking method because it needs to be performed in a high temperature environment of 1000° C. or higher, to perform surface activation treatment on a member to be fused, and to make a surface roughness extremely small.

The present disclosure has been made in view of the above situations, and an object thereof is to provide an electrostatic chuck in which two types of base bodies made of ceramics are stacked by a simple method.

An electrostatic chuck according to the present disclosure comprises:

- a first base body;
- a first adhesive layer;
- a second base body stacked on the first base body with the first adhesive layer interposed therebetween; and
- an electrostatic electrode embedded in the second base body,
- wherein the first base body is made of aluminum oxide ceramics, and
- wherein the second base body is made of aluminum oxide ceramics with a higher purity of aluminum oxide than that of the first base body.

According to the present disclosure, it is possible to provide an electrostatic chuck in which two types of base bodies made of ceramics are stacked by a simple method.

DESCRIPTION OF EMBODIMENTS

Hereinafter, embodiments of the present invention will be described with reference to the drawings. Note that, in the respective drawings, the parts having the same configurations are denoted with the same reference signs, and the redundant descriptions may be omitted.

First Embodiment

[Structure of Substrate Fixing Device]

Figure 1:
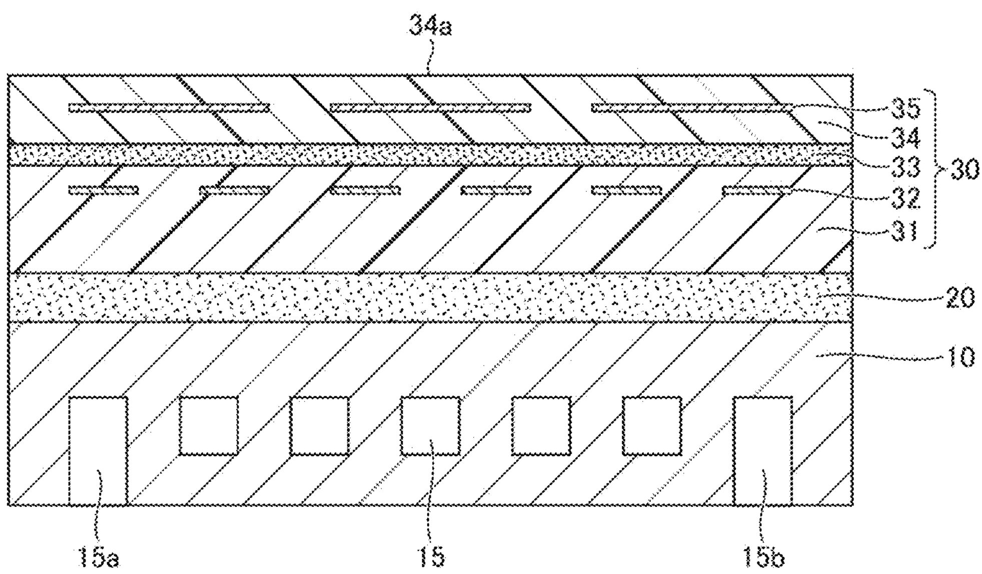
FIG. 1 is a cross-sectional view simplifying and exemplifying a substrate fixing device according to a first embodiment.

FIG. 1 is a cross-sectional view simplifying and exemplifying a substrate fixing device according to a first embodiment. Referring to FIG. 1, a substrate fixing device 1 has, as main constitutional elements, a base plate 10, an adhesive layer 20, and an electrostatic chuck 30.

The base plate 10 is a member for mounting the electrostatic chuck 30. A thickness of the base plate 10 may be, for example, equal to or greater than about 20 mm and equal to or smaller than 50 mm. The base plate 10 may be formed of, for example, metal such as aluminum, copper, or titanium. Among them, it is preferable to use aluminum that is inexpensive and easy to process.

The base plate 10 may also be used as an electrode for controlling plasma, or the like. By supplying predetermined high-frequency electric power to the base plate 10, the energy for causing ions and the like in a generated plasma state to collide with a wafer adsorbed on the electrostatic chuck 30 can be controlled to effectively perform etching processing.

The base plate 10 is provided therein with a flow passage 15. The flow passage 15 has a cooling medium introduction portion 15*a* at one end and a cooling medium discharge portion 15*b* at the other end. The flow passage 15 is connected to a cooling medium control device (not shown) provided outside the substrate fixing device 1. The cooling medium control device (not shown) introduces a cooling medium from the cooling medium introduction portion 15*a* into the flow passage 15 and discharges the cooling medium from the cooling medium discharge portion 15*b*. By circulating the cooling medium in the flow passage 15 to cool the base plate 10, it is possible to cool the wafer adsorbed on the electrostatic chuck 30. As the cooling medium, for example, water or Galden may be used. The base plate 10 may also be provided with a gas passage for introducing an inert gas for cooling the wafer adsorbed on the electrostatic chuck 30, and the like, in addition to the flow passage 15.

The electrostatic chuck 30 is mounted on the base plate 10 with the adhesive layer 20 interposed therebetween. As the adhesive layer 20, silicone-based resin may be used, for example. As the adhesive layer 20, epoxy resin or acrylic resin may also be used. A thickness of the adhesive layer 20 is preferably thick. By increasing the thickness of the adhesive layer 20, an effect of reducing stress resulting from a difference in thermal expansion with the metal base plate is obtained.

The adhesive layer 20 may have a layered structure where a plurality of adhesive layers is stacked. For example, when the adhesive layer 20 is constituted by a two-layered structure where an adhesive having a high thermal conductivity and an adhesive having a low elastic modulus are combined, an effect of further reducing the stress resulting from the difference in thermal expansion with the metal base plate is obtained.

The electrostatic chuck 30 is a part that adsorbs and holds a wafer that is a target object to be adsorbed. A planar shape of the electrostatic chuck 30 may be circular, for example. A diameter of the wafer, which is a target object to be adsorbed of the electrostatic chuck 30, may be, for example, 8 inches, 12 inches or 18 inches. The electrostatic chuck 30 is, for example, a Coulomb force type electrostatic chuck. However, the electrostatic chuck 30 may also be a Johnson-Rahbek type electrostatic chuck.

The electrostatic chuck 30 has a first base body 31, a second base body 34 stacked above the first base body 31 with an adhesive layer 33 interposed therebetween, and an electrostatic electrode 35 embedded in the second base body 34.

The first base body 31 is a dielectric body. Specifically, the first base body 31 is made of aluminum oxide ceramics. In the first base body 31, a purity of aluminum oxide is, for example, 80 weight percent or higher and 97 weight percent or less. A thickness of the base layer 31 is, for example, about 2 to 10 mm.

A conductor 32 may be embedded in the first base body 31. The conductor 32 is, for example, a heat generating element. The heat generating body generates heat by applying a voltage from the outside of the substrate fixing device 1 and heats so that a placement surface 34*a* of the second base body 34 described below reaches a predetermined temperature. The heat generating element can heat the placement surface 34*a* of the second base body 34 to a temperature of about 250° C. to 300° C., for example. As a material for the heat generating element, for example, tungsten (W), molybdenum (Mo), or the like may be used. The heat generating body may be patterned into a concentric circle shape, for example. Note that the conductor 32 may be a single-layer wiring or a multi-layer wiring.

As the adhesive layer 33, silicone-based resin may be used, for example. As the adhesive layer 33, epoxy resin or acrylic resin may also be used. The adhesive layer 33 may be formed of the same material as or a different material from the adhesive layer 20. A thickness of the adhesive layer 33 may be smaller than the thickness of the adhesive layer 20. This is because both the upper and lower sides of the adhesive layer 33 are ceramics substrates, and the coefficients of thermal expansion are approximately the same, so there is no need to increase the thickness for the effect of reducing stress. The thickness of the adhesive layer 33 may be set to be, for example, equal to or larger than 0.1 mm and equal to or smaller than 2 mm.

The second base body 34 is a dielectric body. Specifically, the second base body 34 is made of aluminum oxide ceramics with higher purity of aluminum oxide than that of the first base body 31. In the second base body 34, the purity of aluminum oxide is preferably 97 weight percent, more preferably 98 weight percent or higher, and even more preferably 99 weight percent or higher. A thickness of the second base layer 34 is, for example, about 1 to 5 mm. The difference of the purity of aluminum oxide between the first base body 31 and the second base body 34 is preferably 3% to 5%.

Plasma resistance can be improved by setting the purity of aluminum oxide to 97 weight percent or higher. Note that the purity of 97% or higher indicates that a sintering aid is not added. In addition, the purity of 97% or higher means that unintended impurities may be included during a manufacturing process and the like.

The electrostatic electrode 35 is a thin film electrode, and is embedded in the second base body 34. The electrostatic electrode 35 is connected to a power supply provided outside the substrate fixing device 1, and generates adsorption force between the electrostatic electrode and the wafer by static electricity when a predetermined voltage is applied from the power supply. This makes it possible to adsorb and hold the wafer on the placement surface 34*a* of the second base body 34 of the electrostatic chuck 30. The higher the voltage applied to the electrostatic electrode 35, the stronger the adsorption holding force is. The electrostatic electrode 35 may have a unipolar shape or a bipolar shape. As a material of the electrostatic electrode 35, tungsten, molybdenum or the like may be used, for example.

In order to manufacture the substrate holding device 1, first, an electrostatic chuck 30 is fabricated. Specifically, a first base body 31 having a conductor 32 embedded therein and a second base body 34 having an electrostatic electrode 35 embedded therein are prepared separately. Then, the second base body 34 is stacked on the first base body 31 with an uncured adhesive layer 33 interposed therebetween. Then, the adhesive layer 33 is cured. The temperature when curing the adhesive layer 33 is, for example, about 100° C.

Note that the first base body 31 may be fabricated by a known manufacturing method including, for example, a process of processing a via in a green sheet, a process of filling the via with conductive paste, a process of forming a pattern that becomes the conductor 32, a process of stacking and firing another green sheet, a surface flattening process, and the like. In addition, the second base body 34 may be fabricated by a known manufacturing method including, for example, a process of processing a via in a green sheet, a process of filling the via with conductive paste, a process of forming a pattern that becomes the electrostatic electrode 35, a process of stacking and firing another green sheet, a surface flattening process, and the like.

Next, a base plate 10 in which a flow passage 15 and the like are formed in advance is prepared. Then, the first base body 31 of the electrostatic chuck 30 is stacked on the base plate 10 with an uncured adhesive layer 20 interposed therebetween. Then, the adhesive layer 20 is cured. The temperature when curing the adhesive layer 20 is, for example, about 100° C. As a result, a substrate fixing device 1 is completed.

In this way, the electrostatic chuck 30 has a structure in which the first base body 31 made of aluminum oxide ceramics and the second base body 34 made of aluminum oxide ceramics with a higher purity of aluminum oxide than that of the first base body 31 are stacked with the adhesive layer 33 interposed therebetween. By providing the adhesive layer 33, the two types of base bodies can be easily stacked without using a special method such as high-temperature fusion.

For example, high-temperature fusion needs to be performed in a high temperature environment of 1000° C. or higher, but curing of the adhesive layer 33 can be performed at about 100° C. In addition, in order to perform high-temperature fusion, it is necessary to perform surface activation treatment on a member to be fused or to make a surface roughness extremely small. However, when using the adhesive layer 33, these processes are not required.

Additionally, by setting the purity of aluminum oxide in the second base body 34, which adsorbs and holds the wafer, to 97 weight percent or higher, the plasma resistance of the second base body 34 can be improved.

On the other hand, if the second base body 34 with a high purity of aluminum oxide is thickened and the conductor is stacked in multiple layers, the risk that peeling or cracking will occur in the conductor increases. For example, if the second base body 34 is thickened and the conductor 32 is embedded in the second base body 34 in addition to the electrostatic electrode 35, the risk that peeling or cracking will occur in the electrostatic electrode 35 or the conductor 32 after firing increases. Therefore, in the substrate fixing device 1, the second base body 34 with a high purity of aluminum oxide is not made thicker than necessary and has only the electrostatic electrode 35 embedded therein. This can reduce peeling and cracking of the electrostatic electrode 35 without performing expensive processing such as HIP (Hot Isostatic Pressing) processing.

In addition, in the substrate holding device 1, the purity of aluminum oxide in the first base body 31, which does not adsorb and hold the wafer, is made lower than that in the second base body 34, and the conductor 32 is formed in the first base body 31. By forming the conductor 32 in the first base body 31 of which the purity of aluminum oxide is relatively low, peeling and cracking of the conductor 32 can be reduced without performing expensive processing such as HIP processing. In addition, the first base body 31 of which the purity of aluminum oxide is relatively low may be thickened and the conductor 32 may be formed in multiple layers.

Variations of First Embodiment

In variations of the first embodiment, an example of a substrate fixing device provided with a seal member is shown. Note that in the variations of the first embodiment, the descriptions of the same constitutional parts as those of the embodiment already described may be omitted.

Figure 2:
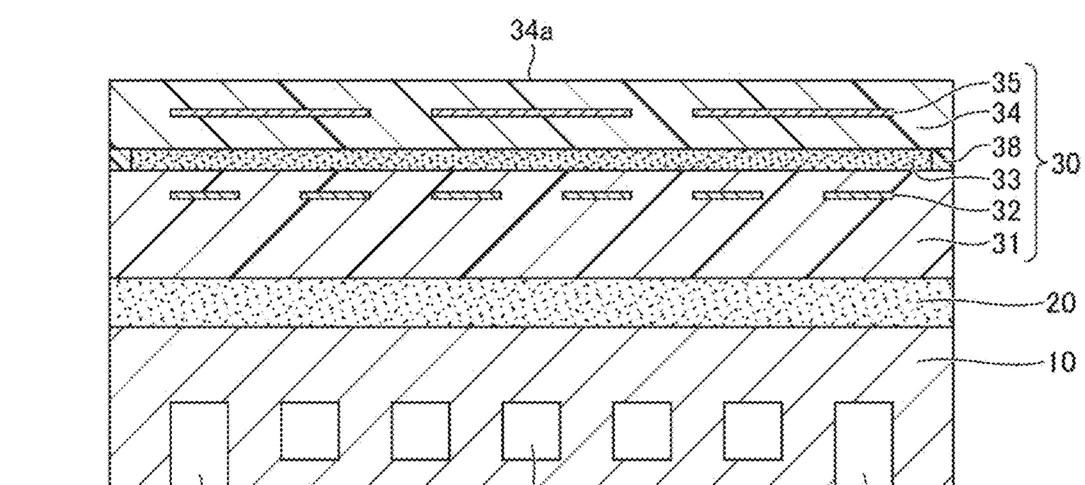
FIG. 2 is a cross-sectional view simplifying and exemplifying a substrate fixing device according to Variation 1 of the first embodiment.

FIG. 2 is a cross-sectional view simplifying and exemplifying a substrate fixing device according to Variation 1 of the first embodiment. As shown in FIG. 2, a substrate holding device 1A differs from the substrate holding device 1 in that it has a seal member 38.

In the substrate fixing device 1A, an annular space in which the adhesive layer 33 is not present is formed in a region where an outer peripheral portion of an upper surface of the first base body 31 and an outer peripheral portion of a lower surface of the second base body 34 face each other, and the seal member 38 is disposed in the space. An upper surface of the seal member 38 is in close contact with the lower surface of the second base body 34, and a lower surface of the seal member 38 is in close contact with the upper surface of the first base body 31. As the seal member 38, an O-ring or the like may be used, for example. As the seal member 38, a resin with higher plasma resistance than the adhesive layer 33 may be used.

In this way, by disposing the seal member 38 so that the adhesive layer 33 is not exposed to the outside of the substrate fixing device 1A, the adhesive layer 33 can be airtightly isolated from plasma, and thus deterioration of the adhesive layer 33 can be suppressed.

Figure 3:
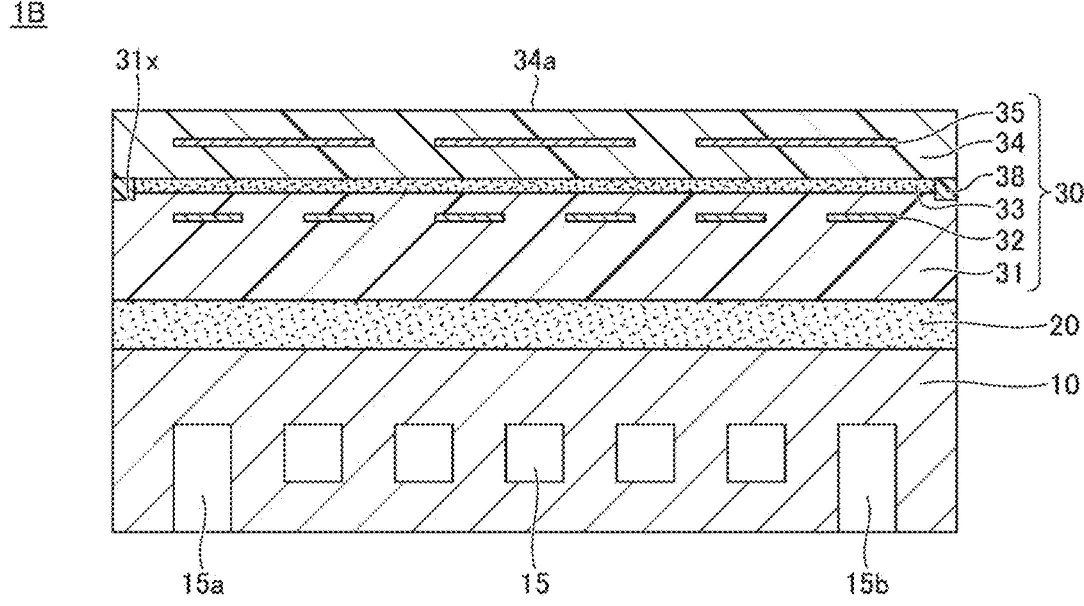
FIG. 3 is a cross-sectional view simplifying and exemplifying a substrate fixing device according to Variation 2 of the first embodiment.

FIG. 3 is a cross-sectional view simplifying and exemplifying a substrate fixing device according to Variation 2 of the first embodiment. As shown in FIG. 3, a substrate holding device 1B differs from the substrate holding device 1A in that an annular groove 31*x* recessed in a direction away from the second base body 34 is provided on the outer peripheral portion of the upper surface of the first base body 31. In the substrate fixing device 1B, an annular space in which the adhesive layer 33 is not present is formed in a region where the groove 31*x* and the outer peripheral portion of the second base body 34 face each other, and the seal member 38 is disposed in the space. The groove 31*x* may be formed by, for example, blast processing. A depth of the groove 31*x* may be set to, for example, 0.1 mm or greater and 2.0 mm or less.

In this way, by providing the groove 31*x* for disposing the seal member 38 on the outer peripheral portion of the first base body 31, the thickness of the adhesive layer 33 can be made small even when the seal member 38 of the same thickness as that of the substrate fixing device 1A is used. In addition, since the thickness of the adhesive layer 33 can be made small, the variation in material selection of the adhesive constituting the adhesive layer 33 is expanded, and an amount of adhesive used is reduced, so the material cost can be reduced.

Figure 4:
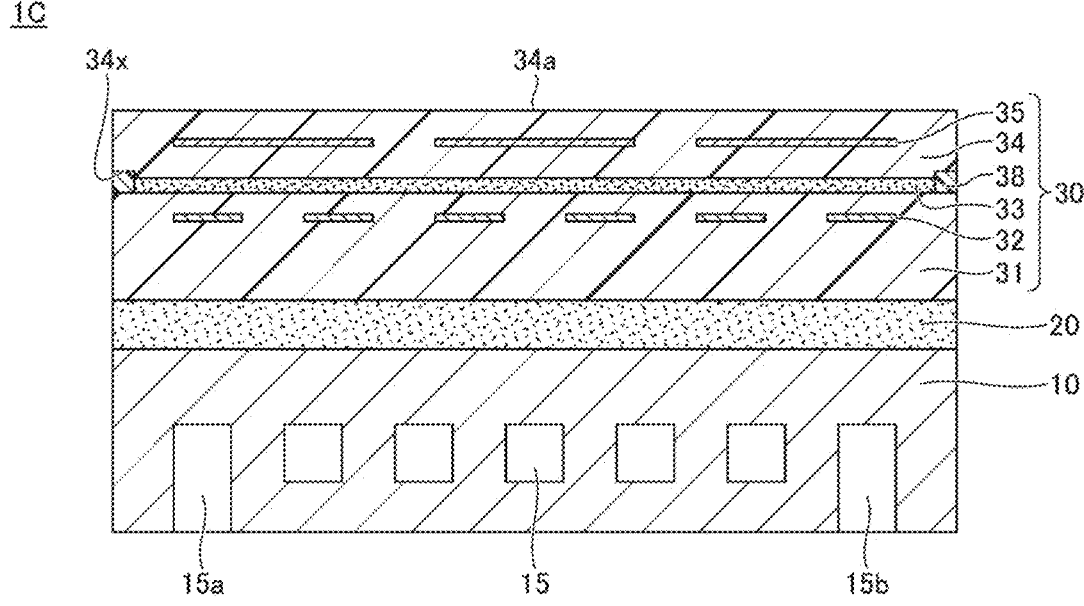
FIG. 4 is a cross-sectional view simplifying and exemplifying a substrate fixing device according to Variation 3 of the first embodiment.

FIG. 4 is a cross-sectional view simplifying and exemplifying a substrate fixing device according to Variation 3 of the first embodiment. As shown in FIG. 4, a substrate holding device 1C differs from the substrate holding device 1A in that an annular groove 34*x* recessed in a direction away from the first base body 31 is provided on the outer peripheral portion of the lower surface of the second base body 34. In the substrate fixing device 1C, an annular space in which the adhesive layer 33 is not present is formed in a region where the groove 34*x* and the outer peripheral portion of the first base body 31 face each other, and the seal member 38 is disposed in the space. The groove 34*x* may be formed by, for example, blast processing. A depth of the groove 34*x* may be set to, for example, 0.1 mm or greater and 2.0 mm or less.

In this way, even when the groove 34*x* for disposing the seal member 38 is provided on the outer peripheral portion of the second base body 34, an effect similar to that of the substrate fixing device 1B can be achieved. Note that the second base body 34 is harder than the first base body 31 because the purity of aluminum oxide is higher than that of the first base body 31. Therefore, it is easier to form the groove 31*x* than to form the groove 34*x*.

Figure 5:
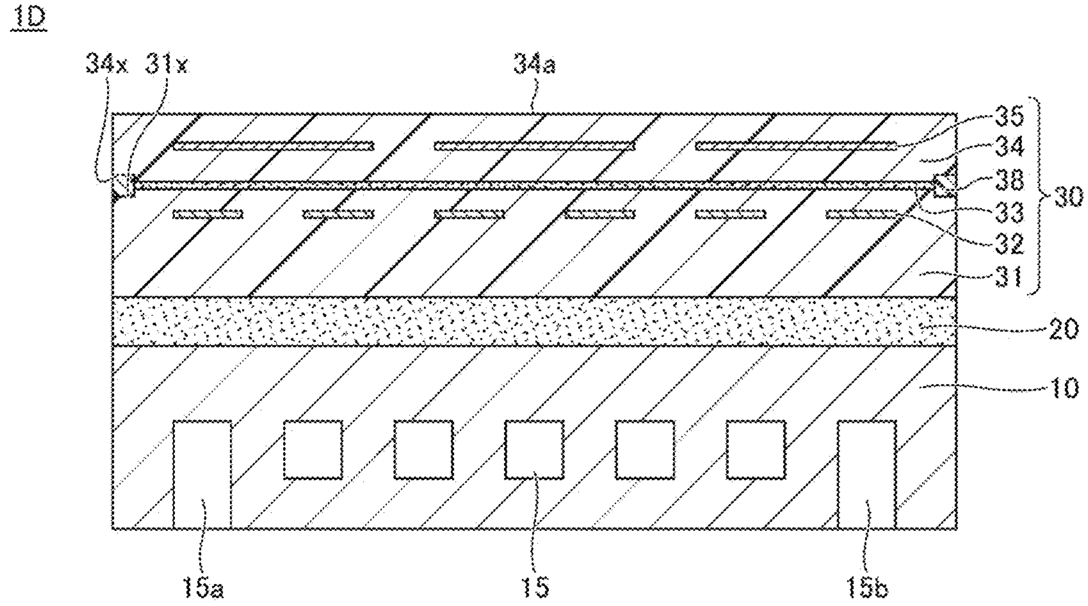
FIG. 5 is a cross-sectional view simplifying and exemplifying a substrate fixing device according to Variation 4 of the first embodiment.

FIG. 5 is a cross-sectional view simplifying and exemplifying a substrate fixing device according to Variation 4 of the first embodiment. As shown in FIG. 5, a substrate fixing device 1D differs from the substrate fixing device 1A in that an annular groove 31*x* recessed in a direction away from the second base body 34 is provided on the outer peripheral portion of the upper surface of the first base body 31 and an annular groove 34*x* recessed in a direction away from the first base body 31 is provided on the outer peripheral portion of the lower surface of the second base body 34. In the substrate fixing device 1D, an annular space in which the adhesive layer 33 is not present is formed in a region where the groove 31*x* and the groove 34*x* face each other, and the seal member 38 is disposed in the space.

In this way, the groove 31*x* and the groove 34*x* for disposing the seal member 38 may be provided on the outer peripheral portions of the first base body 31 and the second base body 34. As a result, even when the seal member 38 of the same thickness as that of the substrate fixing devices 1B and 1C is used, the thickness of the adhesive layer 33 can be further reduced. Additionally, since the amount of adhesive used can be further reduced, the material cost can be further reduced.

Figure 6:
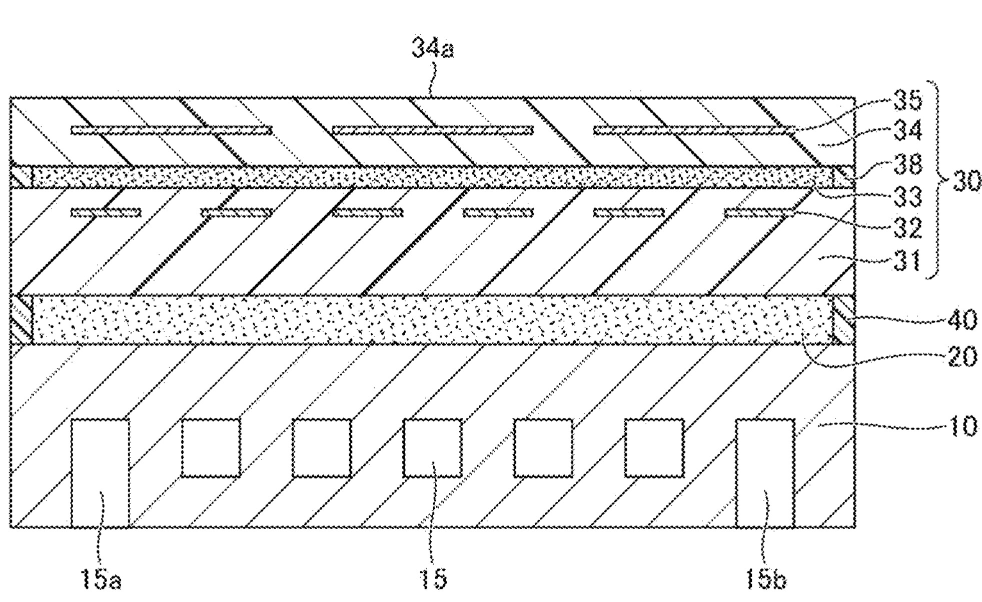
FIG. 6 is a cross-sectional view simplifying and exemplifying a substrate fixing device according to Variation 5 of the first embodiment.

FIG. 6 is a cross-sectional view simplifying and exemplifying a substrate fixing device according to Variation 5 of the first embodiment. As shown in FIG. 6, a substrate fixing device 1E differs from the substrate holding device 1 in that it has a seal member 40.

In the substrate fixing device 1E, an annular space in which the adhesive layer 20 is not present is formed in a region where the outer peripheral portion of the lower surface of the first base body 31 and the outer peripheral portion of the upper surface of the base plate 10 face each other, and the seal member 40 is disposed in the space. An upper surface of the seal member 40 is in close contact with the lower surface of the first base body 31, and a lower surface of the seal member 40 is in close contact with the upper surface of the base plate 10. As the seal member 40, an O-ring or the like may be used, for example. As the seal member 40, a resin with higher plasma resistance than the adhesive layer 20 may be used.

In this way, by disposing the seal member 40 so that the adhesive layer 20 is not exposed to the outside of the substrate fixing device 1E, the adhesive layer 20 can be airtightly isolated from plasma, and thus deterioration of the adhesive layer 20 can be suppressed.

Note that there is no need to provide grooves on the first base body 31 and the base plate 10 in the region where the seal member 40 is disposed. Specifically, as described above, the thicker the adhesive layer 20, the greater the effect of reducing the stress resulting from the difference in thermal expansion between the metal base plate 10 and the first base body 31 made of ceramics. Therefore, there is little technical significance in making the adhesive layer 20 thinner by providing a groove. That is, as shown in FIG. 6, on a surface of the first base body 31 facing the base plate 10, an outer peripheral portion and a central portion are on the same plane. Additionally, on a surface of the base plate 10 facing the first base body 31, an outer peripheral portion and a central portion are on the same plane. When the thickness of the adhesive layer 20 is smaller than the thickness of the seal member 40 in view of restrictions on O-rings, etc., a groove for the seal member 40 may be formed on the base plate 10 or the first base body 31.

Although the preferred embodiments and the like have been described in detail, the present invention is not limited to the above-described embodiments and the like, and a variety of changes and replacements can be made for the above-described embodiments and the like without departing from the scope defined in the claims.

For example, in the substrate fixing devices 1, 1A, 1B, 1C, and 1D, the seal member 40 may be provided in the same or similar manner as or to the substrate fixing device 1E.

In addition, as the target object to be adsorbed of the substrate fixing device of the present invention, a glass substrate and the like that are used in a manufacturing process of a liquid crystal panel and the like may be exemplified, in addition to the semiconductor wafer (silicon wafer, and the like).

What is claimed is:

1. An electrostatic chuck, comprising:
a first base body;
a first adhesive layer;
a second base body stacked on the first base body with the first adhesive layer interposed therebetween;
an electrostatic electrode embedded in the second base body; and
an annular first seal member,
wherein the first base body is made of aluminum oxide ceramics
wherein the second base body is made of aluminum oxide ceramics with a higher purity of aluminum oxide than that of the first base body,
wherein an annular first space in which the first adhesive layer is not present is formed in a region where an outer peripheral portion of the first base body and an outer peripheral portion of the second base body face each other, and
wherein the annular first seal member is disposed in the annular first space.

2. The electrostatic chuck according to claim 1, further comprising:
a conductor embedded in the first base body.

3. The electrostatic chuck according to claim 1, wherein
an annular groove recessed in a direction away from the second base body is provided on an outer peripheral portion of the first base body, and
the annular first space in which the first adhesive layer is not present is formed in a region where the annular groove and an outer peripheral portion of the second base body face each other.

4. The electrostatic chuck according to claim 1, wherein
an annular groove recessed in a direction away from the first base body is provided on an outer peripheral portion of the second base body, and
the annular first space in which the first adhesive layer is not present is formed in a region where the annular groove and an outer peripheral portion of the first base body face each other.

5. The electrostatic chuck according to claim 1, wherein
an annular first groove recessed in a direction away from the second base body is provided on an outer peripheral portion of the first base body,
an annular second groove recessed in a direction away from the first base body is provided on an outer peripheral portion of the second base body, and
the annular first space in which the first adhesive layer is not present is formed in a region where the annular first groove and the annular second groove face each other.

6. A substrate fixing device comprising:
a base plate;
a second adhesive layer; and
the electrostatic chuck according to claim 3 mounted on the base plate with the second adhesive layer interposed therebetween.

7. The substrate fixing device according to claim 6, wherein the second adhesive layer is thicker than the first adhesive layer.

8. The substrate fixing device according to claim 6, comprising:
an annular second seal member,
wherein an annular second space in which the second adhesive layer is not present is formed in a region where an outer peripheral portion of the first base body and an outer peripheral portion of the base plate face each other, and wherein the annular second seal member is disposed in the annular second space.

9. The substrate fixing device according to claim 6, wherein on a surface of the first base body facing the base plate, an outer peripheral portion and a central portion are on the same plane, and wherein on a surface of the base plate facing the first base body, an outer peripheral portion and a central portion are on the same plane.

* * * * *